(12) United States Patent
Clarysse (10) Patent No.: US 11,734,903 B2
(45) Date of Patent: Aug. 22, 2023

(54) GUI FOR EDITING A CAD MODEL

(71) Applicant: BRICSYS NV, Ghent (BE)

(72) Inventor: Pieter Clarysse, Vurste (BE)

(73) Assignee: BRICSYS NV, Ghent (BE)

( * ) Notice: Subject to any disclaimer, the term of this patent is extended or adjusted under 35 U.S.C. 154(b) by 326 days.

(21) Appl. No.: 17/263,468

(22) PCT Filed: Aug. 21, 2019

(86) PCT No.: PCT/EP2019/072410
§ 371 (c)(1),
(2) Date: Jan. 26, 2021

(87) PCT Pub. No.: WO2020/064228
PCT Pub. Date: Apr. 2, 2020

(65) Prior Publication Data
US 2022/0351477 A1 Nov. 3, 2022

(30) Foreign Application Priority Data
Sep. 26, 2018 (EP) ..................... 18196911

(51) Int. Cl.
*G06F 3/048* (2013.01)
*G06T 19/20* (2011.01)
(Continued)

(52) U.S. Cl.
CPC .............. *G06T 19/20* (2013.01); *G06F 30/12* (2020.01); *G06F 3/0482* (2013.01); *G06T 2210/04* (2013.01); *G06T 2219/2004* (2013.01)

(58) Field of Classification Search
CPC ................. G06T 19/20; G06T 2210/04; G06T 2219/2004; G06F 30/12; G06F 3/0482
See application file for complete search history.

(56) References Cited

U.S. PATENT DOCUMENTS 5,019,809 A * 5/1991 Chen .................. G06F 3/04845
345/157
9,715,754 B2 * 7/2017 Bystrov .................... G06T 7/10
(Continued)

FOREIGN PATENT DOCUMENTS

WO 2017/174636 A1 10/2017

OTHER PUBLICATIONS

Harwood Podcast, "Sketchup #11: The Tape Measure Tool," (Dec. 19, 2010).
(Continued)

*Primary Examiner* — David Phantana-angkool
(74) *Attorney, Agent, or Firm* — Maschoff Brennan (57) ABSTRACT

A CAD model comprises an entity comprising an input face comprising a normal direction. Via user input, a translation for the input face in the normal direction is obtained. From the CAD model, a list of faces parallel to the input face is automatically determined. From the list of faces, a snap face comprising a distance along the normal direction to the current position of the input face which is minimal over the list of faces is automatically selected, without acquiring the snap face via user input. Via a visualization means, a snap plane comprising the snap face, and either a coplanar alignment of the input face in the snap plane; or a distance indicator from the input face to the snap plane, are automatically displayed. Via user input, validation of the coplanar alignment or a numerical value for the distance indicator is obtained. The entity is automatically adjusted accordingly.

20 Claims, 9 Drawing Sheets

(51) Int. Cl.
*G06F 30/12* (2020.01)
*G06F 3/0482* (2013.01)

(56) References Cited

U.S. PATENT DOCUMENTS

| | | | | |
|---|---|---|---|---|
| 9,841,750 | B2* | 12/2017 | Willis | G05B 19/4099 |
| 10,061,496 | B2 | 8/2018 | Stone | |
| 10,678,960 | B2* | 6/2020 | Jovanovic | G06T 15/10 |
| 10,950,048 | B2* | 3/2021 | Ohnishi | G06F 3/04845 |
| 11,087,561 | B2* | 8/2021 | Fu | G06T 19/006 |
| 11,204,679 | B1* | 12/2021 | Fischer | G06F 3/04815 |
| 11,373,015 | B2* | 6/2022 | Kumar | G06F 30/17 |
| 11,618,652 | B2* | 4/2023 | Pahlke | B66B 25/006 |
| | | | | 702/141 |
| 2014/0267253 | A1* | 9/2014 | Lipp | G06T 17/20 |
| | | | | 345/420 |
| 2015/0026618 | A1 | 1/2015 | Stone | |
| 2015/0331970 | A1* | 11/2015 | Jovanovic | G06T 15/20 |
| | | | | 703/1 |
| 2020/0019649 | A1* | 1/2020 | Kumar | G06F 30/12 |
| 2020/0089819 | A1* | 3/2020 | Gauderis | G06T 17/10 |
| 2020/0211281 | A1* | 7/2020 | Randon | G06T 17/005 |
| 2021/0081579 | A1* | 3/2021 | Jovanovic | G06F 3/04815 |
| 2021/0141514 | A1* | 5/2021 | Fischer | G06T 19/20 |
| 2022/0351477 | A1* | 11/2022 | Clarysse | G06F 30/00 |
| 2023/0106339 | A1* | 4/2023 | Goyal | G06T 7/97 |
| | | | | 345/634 |

OTHER PUBLICATIONS

European Search Report dated Apr. 2, 2019 as received in Application No. 18196911.
"7—Formlt Snippets—Drag Face and Snapping" (2015).

* cited by examiner

GUI FOR EDITING A CAD MODEL

TECHNICAL FIELD

The invention pertains to the technical field of editing a computer-aided design (CAD) model (G06F17/50) via a graphical user interface (GUI) (G06F3/048), and in particular to dragging a face (G06F3/04845), snapping (G06T3/0081), and parallel alignment (G06T19/20).

BACKGROUND

In Autodesk FormIt 360, a user can align ("snap") a drag face along a drag translation direction into a position coplanar with a second face, by hovering over the second face and thereby acquiring the second face. See, for example, https://www.youtube.com/watch?v=_UmfZ2R3gEA, entitled "7—FormIt Snippets—Drag Face and Snapping" (2015).

In SketchUp, a user can align ("snap") a push-pull face along a push-pull translation direction into a position coplanar with a second face, by hovering over the second face and thereby acquiring the second face. See, for example, https://www.youtube.com/watch?v=efOE4vpQ79U, entitled "Sketchup #11: The Tape Measure Tool" (2010), and in particular the part from 11:54 to 12:35.

U.S. Pat. No. 10,061,496 B2 discloses snapping of object features via dragging. A first user input indicates a first location and a source object. The source object comprises a plurality of source features. A source feature from the source object is selected based on shortest distance to the first location. A second user input indicates a current location and a current target object. The current target object comprises a plurality of target features. A target feature of the current target object within a predetermined distance of the current location is determined. The source feature is snapped onto the determined target feature.

The objective of both the present invention as well as the above-recited prior art is relative alignment of a first face with respect to a second face. The desired second face as well as the relative alignment are known beforehand, and are to be realized via a GUI. Such relative alignment may be coplanar alignment or alignment at a desired relative distance. The need for relative alignment of the first face may arise during editing of a CAD model, for example editing the geometry of an entity comprising the first face or repositioning the entity comprising the first face. Initially, the first face is acquired for repositioning along a translation direction. During such repositioning, it may be difficult or impossible for a user to indicate the second face for relative alignment. This difficulty or impossibility may arise because many faces neighbor the second face, because the second face is an interior face of a solid and is therefore not displayed, or because the second face lies outside of the current view frustum of the GUI.

The present invention aims to resolve at least some of the problems mentioned above.

SUMMARY OF THE INVENTION

In a first aspect, the present invention provides a computer-implemented method (CIM) for editing a computer-aided design (CAD) model, according to claim 1 or claim 7.

In a second aspect, the present invention provides a computer system for editing a CAD model, whereby the computer system is configured for performing the CIM according to the first aspect of the present invention.

In a third aspect, the present invention provides a computer program product (CPP) for editing a CAD model, whereby the CPP comprises instructions for performing the CIM according to the first aspect of the present invention. The CPP comprises in particular instructions which, when the CPP is executed by a computer, cause the computer to carry out the CIM according to the first aspect of the present invention. The present invention may further provide a tangible non-transitory computer-readable data carrier comprising the CPP.

The present invention is advantageous because it realizes automatic snap face selection. The snap face is selected without acquiring the snap face via a user input device. The present invention in particular enables automatic snap face selection whereby the snap face does not intersect, i.e. does not at least partially coincide, with any translation of the input face along the normal direction. The displayed snap plane comprising the snap face preferably comprises a spatial extent such that it may comprise a translation of the input face along the normal direction.

The present invention lowers the physiological burden for a user for relative parallel face alignment. The present invention enables relative parallel face alignment with respect to an unhoverable second face in the current GUI view frustum, without altering the GUI view frustum. The present invention enables relative parallel face alignment with respect to a second face outside of the current GUI view frustum. The present invention enables using an enlarged (zoomed in) portion of the CAD model in a current GUI view frustum, for example for enabling selection of a first face, while maintaining an overview of a zone of interest which is larger than the displayed portion of the CAD model, in particular allowing to indicate parallel face snapping candidates outside of the presently displayed portion of the CAD model in the current GUI view frustum, cfr. T 0928/03.

Furthermore, using a snap plane provides additional information in the user's current field of attention, in comparison to a snap line. Translation of the input face along the normal direction may result in snapping to a suggested snap face. In case the user desires to snap to another second face, the relative position along the normal direction of the second face with respect to the suggested snap face may not be apparent with a snap line for certain perspective views, but is immediately apparent with a snap plane, as a snap plane visually indicates a partitioning of the full space into two half-spaces. The user therefore immediately known whether to reposition the input face "forward" or "backward" along the normal direction, when utilizing the present invention.

DETAILED DESCRIPTION OF THE INVENTION

The present invention concerns a computer-implemented method (CIM), a computer system, and a computer program product (CPP) for editing a computer-aided design (CAD) model. The invention has been summarized in the corresponding section above. In what follows, the invention will be described in detail, preferred embodiments are discussed, and the invention will be illustrated by means of non-limitative examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

Term Definitions

"A", "an", and "the" as used herein refer to both singular and plural referents unless the context clearly dictates otherwise. By way of example, "a compartment" refers to one or more than one compartment.

"Comprise", "comprising", and "comprises" and "comprised of" as used herein are synonymous with "include", "including", "includes" or "contain", "containing", "contains" and are inclusive or open-ended terms that specify the presence of what follows (e.g. component) and do not exclude or preclude the presence of additional, non-recited components, features, elements, members, and steps.

"Based on" as used herein is synonymous with "based at least in part on" and is an inclusive or open-ended term that specifies the presence of what follows (e.g. component) and does not exclude or preclude the presence of additional, non-recited components, features, elements, members, and steps.

A "computer-aided design model" (CAD model) as used herein comprises computer-processable data, preferably digital data, about one or more entities. The data represents, or allows to derive, one or more properties of an entity, such as geometric properties, material properties and/or semantic properties. In case the CAD model comprises computer-processable data about multiple entities, the data also represents, or allows to derive, relative geometric properties between entities.

An "entity" as used herein is a computer-processable representation, preferably a digital representation, of a modelled element, e.g. a building element or a mechanical component. An entity may be a solid, a surface or a curve. A non-limiting list of examples of representation schemes for entities comprises boundary representation, cell decomposition, constructive solid geometry, function representation, indirect history-based modelling, parametrized primitive instancing, spatial occupancy enumeration, surface mesh modeling and sweeping. An entity may comprise one or more subentities, wherein a subentity is a vertex, an edge or a face. A solid may comprise vertices, edges and faces. A surface may comprise vertices, edges and faces. An entity as used herein is preferably a solid.

A CAD model may be viewed and edited via a corresponding CPP, so-called CAD software. A non-limiting list of examples of CAD software comprises 123D, ACIS, Advance Concrete, Advance Design, Advance Steel, AllyCAD, ArchiCAD, AutoCAD, BricsCAD, BRL-CAD, C3D, Caddie, Cadwork, CATIA, Chief Architect, Cobalt, Creo, DataCAD, DesignSpark Mechanical, Digital Project, Drawing Express, FINE MEP, form•Z, FreeCAD, HiCAD, IDEA Architectural, Inventor, IRONCAD, ItelliCAD, KeyCreator, LibreCAD, MEDUSA, MicroStation, Modelur, NanoCAD, NX, OpenCASCADE, OpenSCAD, Parasolid, PTC Creo, PowerCADD, progeCAD, PunchCAD, QCad, Revit Architecture, Revit MEP, Revit Structure, Rhinoceros 3D, RoutCad, SALOME, ShapeManager, SketchUp, Solid Edge, Solid Works, SolveSpace, SpaceClaim, SpaceClaim Engineer, Tekla Structures, TopSolid, TransMagic, TurboCAD, VariCAD, VectorWorks, and VisualARQ.

The skilled person appreciates that a CAD model in essence comprises a type of vector image defined in terms of low-level features, which may be edited by a graphical user interface (GUI), such as a GUI provided by one of the non-limiting list of examples of CAD software. The present invention pertains to aspects of a GUI for editing a CAD model.

A non-limiting list of "geometric properties" of an entity comprises a position; an orientation; a dimension, such as a length, a width, a height, a thickness, a diameter, and the like; an inclination, such as with the vertical axis; a direction of a principal axis; and a radius of curvature.

A non-limiting list of "relative geometrical properties" of two entities comprises a relative distance; a relative orientation; a relative position, such as a relative height; a relative angle, such as a relative angle between faces or axes; and a relative size, such as a relative dimension, relative area, or relative volume.

A non-limiting list of "material properties" of an entity comprises a material specification or composition; a tensile strength per area; a melting temperature; a price per volume or weight; and a density.

A non-limiting example of a "semantic property" of an entity is a function classification, such as wall, roof, beam, bolt, shaft, and the like.

The following non-limiting examples in this paragraph provide ways to determine "a distance along a direction" between a first item and a second item. In a first example, a first auxiliary plane perpendicular to the direction may be determined which is tangent to or comprises the first item, a second auxiliary plane perpendicular to the direction may be determined which is tangent to or comprises the second item, in which case the distance along the direction between the first and second items may be determined as (and is equal to) the distance between the first and second auxiliary planes. In a second example, an auxiliary vector from the first to the second item (or alternatively from the second to the first item) may be determined and projected onto the direction yielding a projected auxiliary vector, in which case the distance along the direction between the first and second items may be determined as (and is equal to) the norm of the projected auxiliary vector.

ASPECTS OF THE PRESENT INVENTION

In a first aspect, the present invention provides a computer-implemented method (CIM) for editing a computer-aided design (CAD) model, comprising several steps.

In a second aspect, the present invention provides a computer system for editing a CAD model, whereby the computer system is configured for performing the CIM according to the first aspect.

In a third aspect, the present invention provides a computer program product (CPP) for editing a CAD model, whereby the CPP comprises instructions for performing the CIM according to the first aspect. The CPP in particular comprises instructions which, when the CPP is executed by a computer, such as a computer system according to the second aspect, cause the computer to carry out the CIM according to the first aspect. The present invention may further provide a tangible non-transitory computer-readable data carrier comprising the CPP according to the third aspect.

The aspects of the present invention are hence interrelated. Therefore, all features disclosed in this document, above or below, may relate to each of these aspects, even if they have been disclosed in conjunction with a particular aspect.

The CIM comprises several steps. An input face comprising an original position is obtained from the CAD model based on a first signal obtained via a user input device. The CAD model comprises an entity comprising the input face. Preferably, the entity is a three-dimensional solid. The input face comprises a normal direction perpendicular to the input face. The input face is preferably planar, i.e. the input face is a planar input face. The first signal obtained via the user input device may, for example, relate to hovering a cursor over the input face via a computer mouse and selecting the input face by clicking a button of the computer mouse.

A current translation in the normal direction for the input face is obtained based on a second signal obtained via a user input device. The original position and the current translation define a current position. This step may or may not relate to the same user input device. The second signal obtained via the user input device may, for example, relate to moving the cursor via the computer mouse.

From the CAD model, a list of faces parallel to the input face is automatically determined.

From the list of faces, a snap face comprising a distance along the normal direction to the current position which is minimal over the list of faces is automatically selected. The snap face is selected without acquiring the snap face via a user input device.

Via a visualization means a snap plane comprising the snap face is automatically displayed. The displayed snap plane may be a rectangle. The displayed snap plane may comprise a visual snap indication. The visual snap indication may be a hatch pattern, a color, a thickened border, or the like. The computer system according to the second aspect may comprise the user input device and/or the visualization means.

In addition to the snap plane,
- a coplanar alignment of a translation along the normal direction of the input face in the snap plane; or
- a distance indicator from the current position of the input face to the snap plane, are also automatically displayed via the visualization means.

In the former case, an acceptance of the displayed coplanar alignment may be obtained based on a confirmation signal obtained via a user input device. The confirmation signal obtained via the user input device may, for example, relate to clicking a button of a computer mouse. The entity of the CAD model comprising the input device is then automatically adjusted according to the displayed coplanar alignment.

In the latter case, an overwriting numerical value for the distance indicator may be obtained based on an overwriting signal obtained via a user input device. The overwriting signal obtained via the user input device may, for example, relate to a number entered via a keyboard. The entity of the CAD model comprising the input face is then automatically adjusted according to the overwriting numerical value.

The present invention is advantageous because it realizes automatic snap face selection. The snap face is selected without acquiring the snap face via a user input device. The present invention in particular enables automatic snap face selection whereby the snap face does not intersect, i.e. does not at least partially coincide, with any translation of the input face along the normal direction. The displayed snap plane comprising the snap face preferably comprises a spatial extent such that it may comprise a translation of the input face along the normal direction.

The present invention lowers the physiological burden for a user for relative parallel face alignment. The present invention enables relative parallel face alignment with respect to an unhoverable second face in the current GUI view frustum, without altering the GUI view frustum. The present invention enables relative parallel face alignment with respect to a second face outside of the current GUI view frustum. The present invention enables using an enlarged (zoomed in) portion of the CAD model in a current GUI view frustum, for example for enabling selection of a first face, while maintaining an overview of a zone of interest which is larger than the displayed portion of the CAD model, in particular allowing to indicate parallel face snapping candidates outside of the presently displayed portion of the CAD model in the current GUI view frustum, cfr. T 0928/03.

Furthermore, using a snap plane provides additional information in the user's current field of attention, in comparison to a snap line. Translation of the input face along the normal direction may result in snapping to a suggested snap face. In case the user desires to snap to another second face, the relative position along the normal direction of the second face with respect to the suggested snap face may not be apparent with a snap line for certain perspective views, but is immediately apparent with a snap plane, as a snap plane visually indicates a partitioning of the full space into two half-spaces. The user therefore immediately known whether to reposition the input face "forward" or "backward" along the normal direction, when utilizing the present invention.

In a preferred embodiment, the list of faces is determined based on the current translation. Therefore, in this embodiment, the list of faces is determined after obtaining the current translation.

In a preferred embodiment, from the CAD model a set of entities is determined. Preferably, the entities of the set of entities are three-dimensional solids. Each entity of the set of entities is at least partially positioned within a filter box. The filter box comprises two filter planes parallel to the input face. The filter planes are preferably unbounded in directions parallel to the filter planes. The filter box encompasses the current position. The list of faces parallel to the input face is then determined from the set of entities. Thereby, the faces of the list of faces may or may not be spatially limited to be positioned within the filter box comprising the faces.

In a preferred embodiment, the set of entities is determined from the CAD model by querying a spatial tree of the CAD model based on the filter box or the two filter planes. This is advantageous as querying a spatial tree allows for efficient determination of neighboring and/or spatially related entities in a CAD model. The thickness of the filter box, i.e. the distance in between the two filter planes, may be obtained based on a signal obtained via a user input device. Alternatively or additionally, the thickness of the filter box may be preset. Preferably, every time a current translation in the normal direction for the input face is obtained, the spatial tree is queried based on the filter box or the two filter planes. For example, at each cursor move obtained via a computer mouse, the spatial tree is queried based on the filter box or the two filter planes.

In an alternative preferred embodiment, the list of faces comprises all other faces of the CAD model which are parallel to the input face or a subset of all other faces of the CAD model which are parallel to the input face. Hereby, 'other' refers to the input face, i.e. the list of faces in the present embodiment comprises all faces of the CAD model which are parallel to the input face other than the input face. In this case, the current translation may be obtained after determining the list of faces. Preferably, the input face is a planar input face. Preferably, all other faces of the CAD model are all other planar faces of the CAD model or a subset of all other planar faces of the CAD model.

In a preferred embodiment, the list of faces comprises a subset of all other faces of the CAD model which are parallel to the input face. Preferably, the CAD model comprises one or more entities comprising all other faces of the CAD model which are parallel to the input face. Preferably, whether the subset comprises a parallel face is determined based on one, two, three, four, or all of:
- a scope zoom level, such as a percentage of the current zoom level, whereby the subset comprises the parallel face when the parallel face or an entity comprising the parallel face would be visible in said scope zoom level;
- one or more semantic properties of an entity comprising the parallel face;
- one or more geometric properties of an entity comprising the parallel face;
- one or more material properties of an entity comprising the parallel face;
- one or more relative geometric properties of an entity comprising the parallel face and the entity comprising the input face.

This avoids snapping to an excessive amount of snap faces, as the list of faces is limited. Most preferably, the subset comprises a parallel face when the entity comprising the parallel face has a semantic classification corresponding with the semantic classification of the entity comprising the input face. Correspondence of semantic classifications may be predetermined via heuristic rules. Examples comprise snapping of a face of a wall to the face of another wall or a slab, while the snapping of a face of a wall to a face of a vehicle is preferably avoided. Alternative and/or additional to correspondence of semantic classification, correspondence of one or more geometric properties and/or one or more material properties may be utilized.

In a preferred embodiment, each face of the list of faces comprises an offset from the original position. An offset is hereby a positive, negative or zero numerical value indicating distance along the normal direction to the original position. The faces of the list of faces are then sorted based on the offsets. Preferably, the snap face is selected from the list of sorted faces based on the offsets and the current translation. The snap face may then be selected from the list of sorted faces based on a closest offset with respect to the current translation, i.e. an offset which is closest to the current translation. Preferably, every time a current translation in the normal direction for the input face is obtained, a snap face is selected from the list of sorted faces based on a closest offset with respect to the current translation. For example, at each cursor move obtained via a computer mouse, a snap face is selected from the list of sorted faces based on a closest offset with respect to the current translation.

In a preferred embodiment, whether the distance along the normal direction of the snap face to the current position is smaller than a threshold value is verified. The threshold value may be obtained based on a signal obtained via a user input device. Alternatively or additionally, the threshold value may be preset.

In a preferred embodiment, via the visualization means a coplanar alignment of a translation along the normal direction of the input face in the snap plane is displayed. Preferably, the coplanar alignment is displayed in case the distance along the normal direction of the snap face to the current position is smaller than a threshold value. In this embodiment, a translation along the normal direction of the input face may follow a current translation as obtained via a user input device until the distance along the normal direction of the current position to the snap face is smaller than the threshold value, during which a coplanar alignment of the translation along the normal direction of the input face and the snap plane is displayed, until the distance along the normal direction of the current position to the snap face is again larger than the threshold value. A distance window (distance along the normal direction) of twice the threshold value is thereby provided in which:
- the translation along the normal direction of the input face is displayed as coplanar to the snap face, and
- user acceptance of the coplanar alignment may be obtained, see further below.

Should a positioning according to a non-zero distance along the normal direction to the snap plane be desired, a user may use the toggling of a distance indicator, as described below.

In a preferred embodiment, via the visualization means a distance indicator from a translation along the normal direction of the input face to the snap plane is displayed. Preferably, via the visualization means a distance indicator from the current position of the input face to the snap plane is displayed.

In a preferred embodiment, a distance indicator from a translation along the normal direction of the input face to a face at the original position is displayed via the visualization means. Preferably, a distance indicator from the current position of the input face to the face at the original position is displayed via the visualization means. Upon obtaining a toggle indication for the distance indicator based on a toggle signal obtained via a user input device, e.g. a TAB key on a keyboard, a distance indicator from the translation along the normal direction of the input face to the snap plane is displayed, preferably instead of the distance indicator from the translation along the normal direction of the input face to the face at the original position. Upon obtaining a toggle indication for the distance indicator based on a toggle signal obtained via a user input device, e.g. a TAB key on a keyboard, a distance indicator from the current position of the input face to the snap plane is displayed, preferably instead of the distance indicator from the current position of the input face to the face at the original position. An overwriting numerical value for the distance indicator may be obtained based on an overwriting signal obtained via a user input device, e.g. one or more number keys on a keyboard.

Hereby, the translation along the normal direction of the input face may or may not relate to a face comprising the same size as the input face at the original position. In a first example, a push/pull operation may be performed on an input face of a three-dimensional cube, whereby the faces tangent to the input face may be elongated due to the push/pull operation and the size of the dragged input face remains invariant. In a second example, a push/pull operation may be performed on a top face of a frustum of a pyramid, whereby the size of the dragged input face may become smaller or larger dependent on the translation.

The CAD model comprises an entity comprising the input face. A new position for the input face based on the snap face is obtained based on a third signal obtained via a user input device. The third signal may thereby be the overwriting signal. Alternatively, upon displaying the coplanar alignment, an acceptance of the displayed coplanar alignment may be obtained based on a confirmation signal obtained via a user input device, in which case the third signal is the confirmation signal. The entity of the CAD model comprising the input face is then adjusted based on the new position. The present invention may relate to a direct modelling operation (e.g. push/pull or drag operation on the input face of the entity), in which case the geometry of the entity is adjusted. The present invention may alternatively relate to a translation of the entity, in which case the position of the entity is adjusted.

The invention is further described by the following non-limiting examples which further illustrate the invention, and are not intended to, nor should they be interpreted to, limit the scope of the invention.

Example 1: First Exemplary Embodiment

Figure 1:
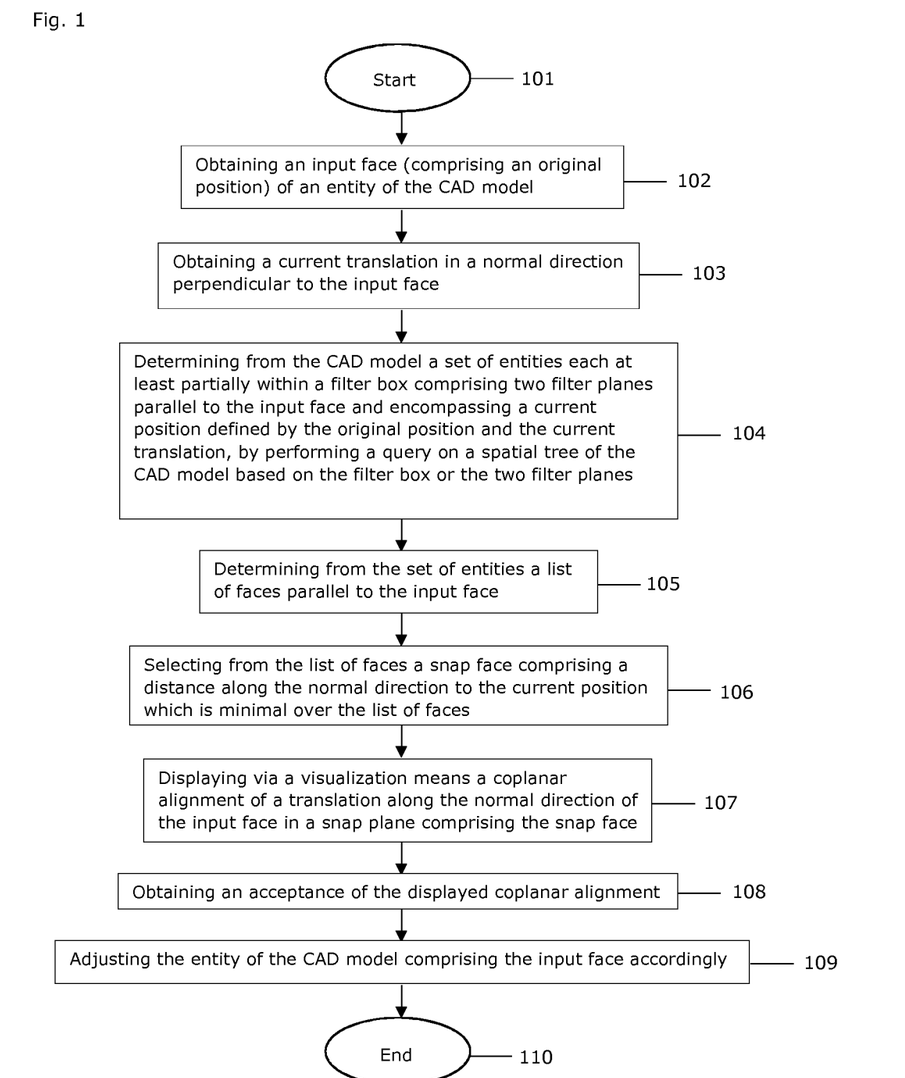
FIGS. 1, 2, 3 and 4 show schematic representations of examples of embodiments according to the present invention.

FIG. 1 shows a schematic representation of an embodiment according to the present invention. The embodiment comprises multiple steps, which are sequentially performed from start (101) to end (110).

An input face of an entity of the CAD model is obtained (102), whereby the input face comprises an original position, based on a first signal obtained via a user input device. The input face comprises a normal direction perpendicular to the input face. A current translation in the normal direction is obtained (103) for the input face, based on a second signal obtained via a user input device. The original position and the current translation define a current position. The CAD model comprises a spatial tree. By querying the spatial tree based on a filter box comprising two filter planes parallel to the input face and encompassing the current position, or by querying the spatial tree based on two filter planes parallel to the input face with the current position in between, a set of entities from the CAD model is determined (104). Hereby, each entity is at least partially positioned within the filter box, or at least partially positioned in between the two filter planes. From the set of entities, a list of faces parallel to the input face is determined (105). From the list of faces, a snap face is selected which comprises a distance along the normal direction to the current position which is minimal over the list of faces (106).

Via a visualization means, a coplanar alignment of a translation along the normal direction of the input face in a snap plane comprising the snap face is displayed (107). An acceptance of the displayed coplanar alignment is obtained (108), based on a confirmation signal obtained via a user input device. The entity of the CAD model which comprises the input face is adjusted accordingly (109).

Example 2: Second Exemplary Embodiment

Figure 2:
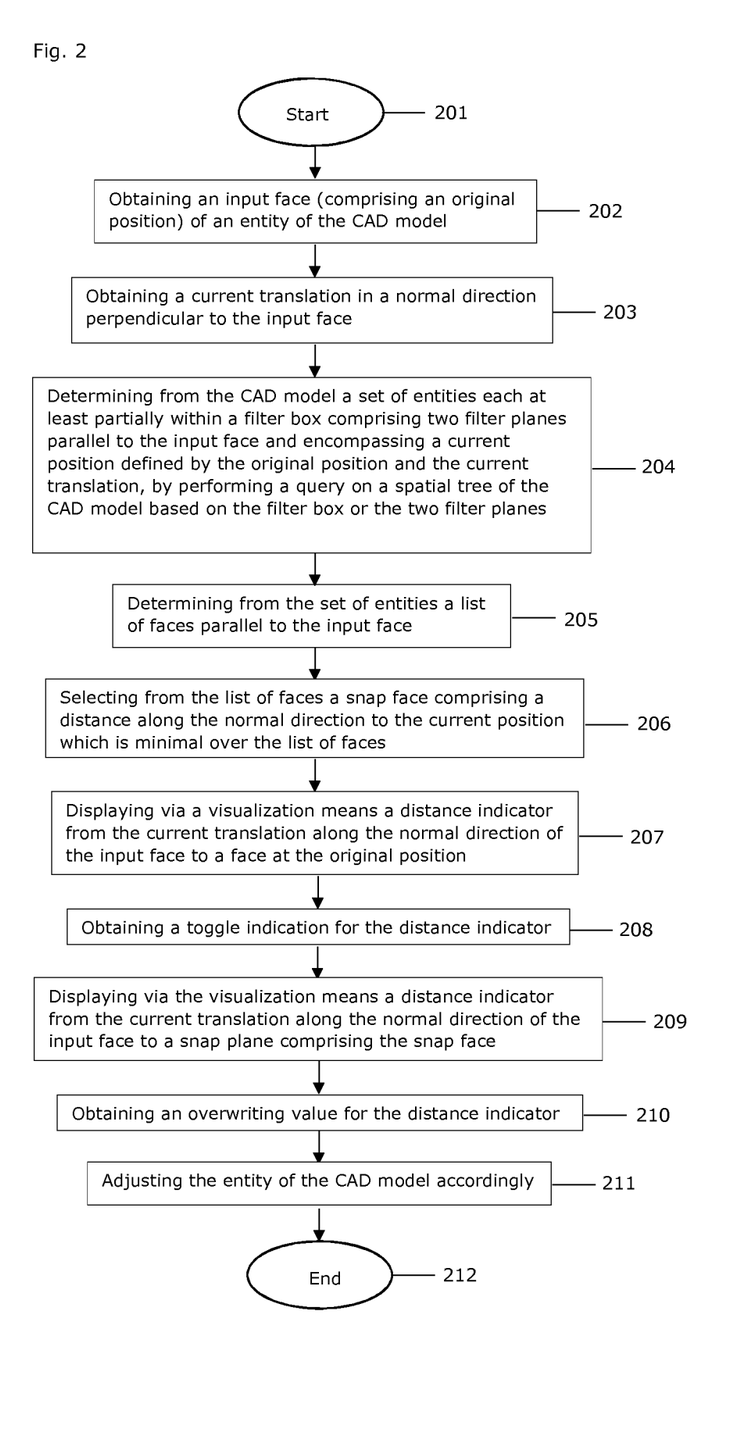

FIG. 2 shows a schematic representation of an embodiment according to the present invention. The embodiment comprises multiple steps, which are sequentially performed from start (201) to end (212).

An input face of an entity of the CAD model is obtained (202), whereby the input face comprises an original position, based on a first signal obtained via a user input device. The input face comprises a normal direction perpendicular to the input face. A current translation in the normal direction is obtained (203) for the input face, based on a second signal obtained via a user input device. The original position and the current translation define a current position. The CAD model comprises a spatial tree. By querying the spatial tree based on a filter box comprising two filter planes parallel to the input face and encompassing the current position, or by querying the spatial tree based on two filter planes parallel to the input face with the current position in between, a set of entities from the CAD model is determined (204). Hereby, each entity is at least partially positioned within the filter box, or at least partially positioned in between the two filter planes. From the set of entities, a list of faces parallel to the input face is determined (205). From the list of faces, a snap face is selected which comprises a distance along the normal direction to the current position which is minimal over the list of faces (206).

Via a visualization means, a distance indicator from the current translation along the normal direction of the input face to an original face at the original position is displayed (207). A toggle indication for the distance indicator is obtained (208) based on a toggle signal obtained via a user input device. Via the visualization means, a distance indicator from the current translation along the normal direction of the input face to a snap plane comprising the snap face is displayed (209), instead of the distance indicator from the translation along the normal direction of the input face to the original face at the original position. An overwriting value for the distance indicator is obtained (210), based on an overwriting signal obtained via a user input device. The entity of the CAD model which comprises the input face is adjusted accordingly (211).

Example 3: Third Exemplary Embodiment

Figure 3:
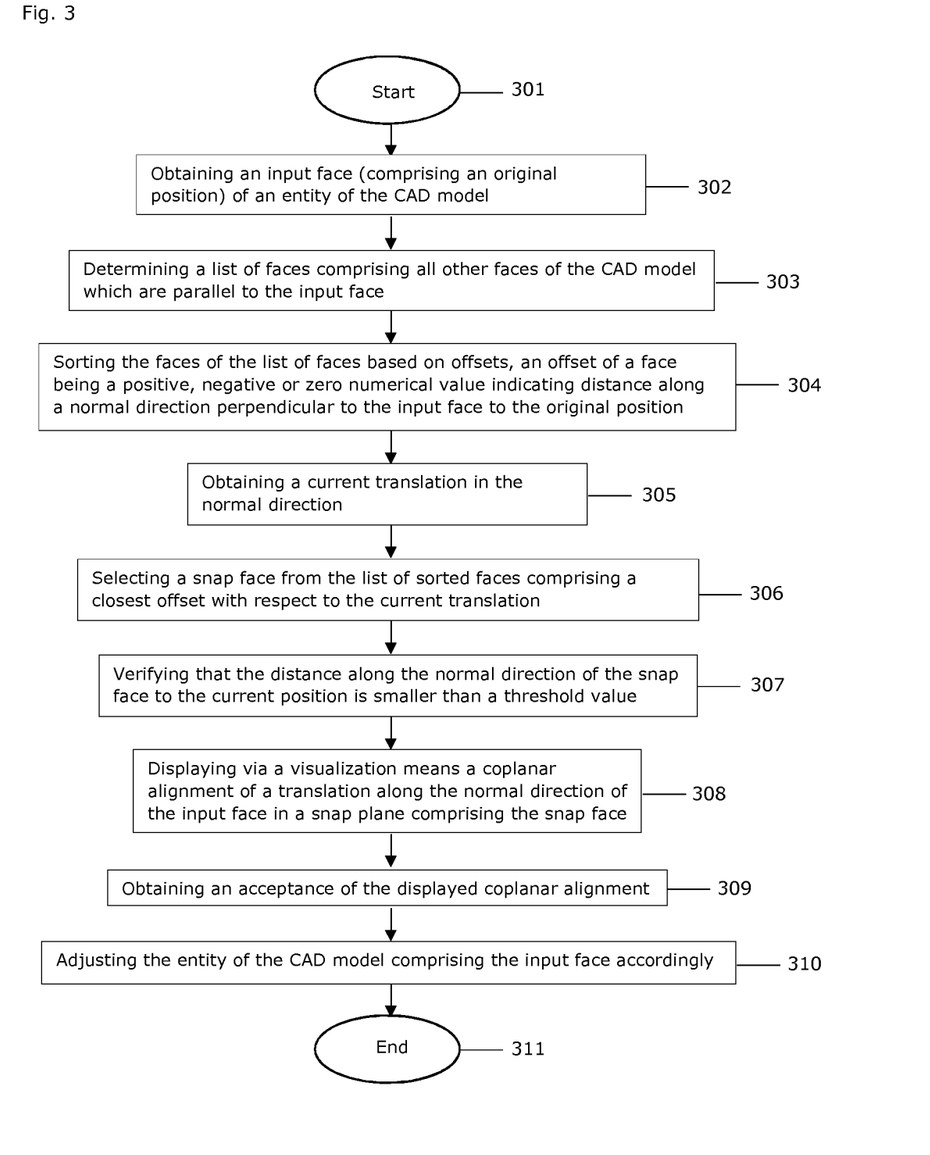

FIG. 3 shows a schematic representation of an embodiment according to the present invention. The embodiment comprises multiple steps, which are sequentially performed from start (301) to end (311).

An input face of an entity of the CAD model is obtained (302), whereby the input face comprises an original position, based on a first signal obtained via a user input device. The input face comprises a normal direction perpendicular to the input face. A list of faces comprising all other faces of the CAD model which are parallel to the input face is determined (303). The faces of the list of faces are sorted based on offsets (304). An offset of a face is a positive, negative or zero numerical value indicating distance along the normal direction to the original position. A current translation in the normal direction is obtained (305) for the input face, based on a second signal obtained via a user input device. A snap face is selected from the list of sorted faces comprising a closest offset with respect to the current translation (306). Verification is performed that the distance along the normal direction of the snap face to the current position is smaller than a threshold value (307).

Via a visualization means, a coplanar alignment of a translation along the normal direction of the input face in a snap plane comprising the snap face is displayed (308). An acceptance of the displayed coplanar alignment is obtained (309), based on a confirmation signal obtained via a user input device. The entity of the CAD model which comprises the input face is adjusted accordingly (310).

Example 4: Fourth Exemplary Embodiment

Figure 4:
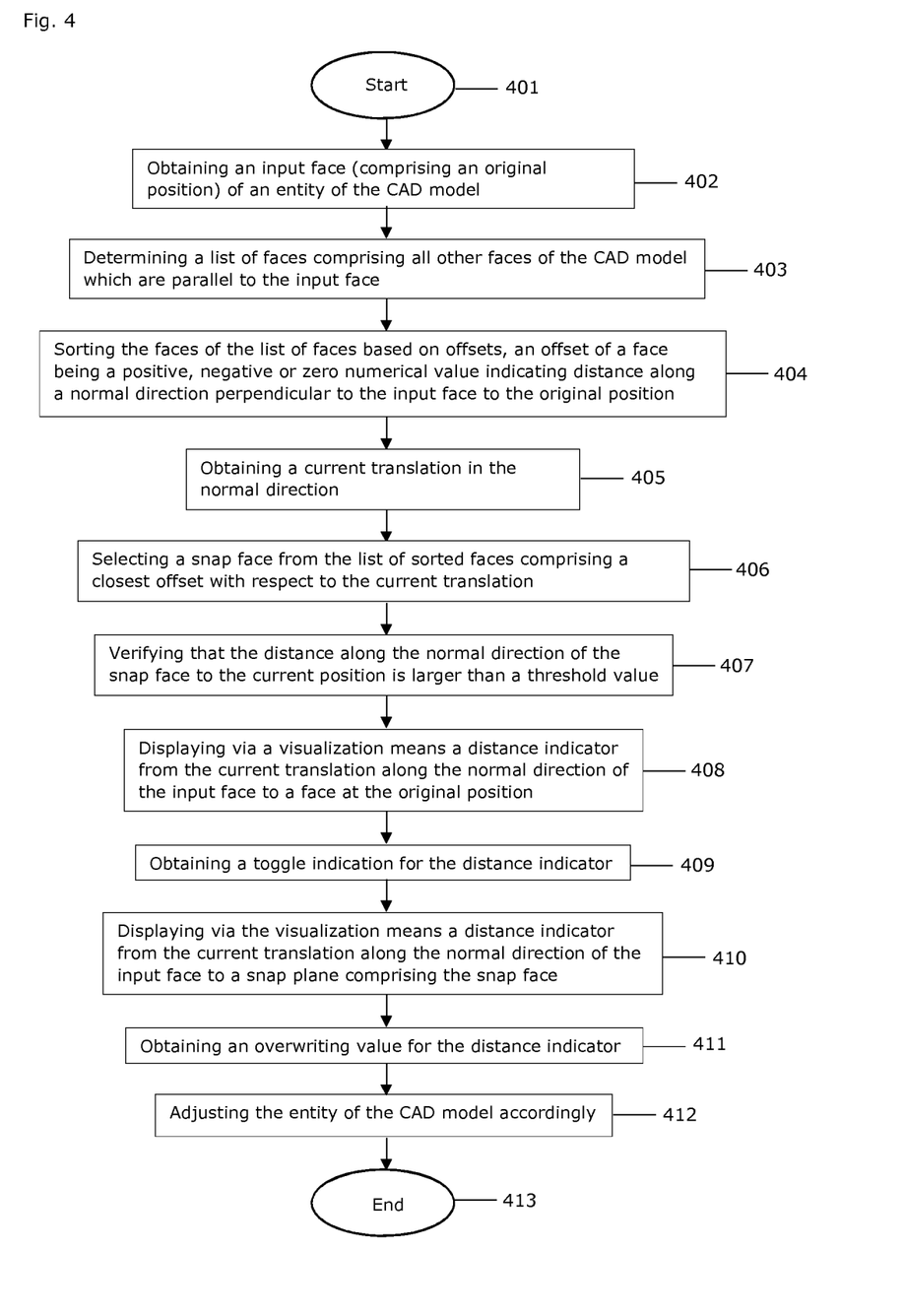

FIG. 4 shows a schematic representation of an embodiment according to the present invention. The embodiment comprises multiple steps, which are sequentially performed from start (401) to end (413).

An input face of an entity of the CAD model is obtained (402), whereby the input face comprises an original position, based on a first signal obtained via a user input device. The input face comprises a normal direction perpendicular to the input face. A list of faces comprising all other faces of the CAD model which are parallel to the input face is determined (403). The faces of the list of faces are sorted based on offsets (404). An offset of a face is a positive, negative or zero numerical value indicating distance along the normal direction to the original position. A current translation in the normal direction is obtained (405) for the input face, based on a second signal obtained via a user input device. A snap face is selected from the list of sorted faces comprising a closest offset with respect to the current translation (406). Verification is performed that the distance along the normal direction of the snap face to the current position is smaller than a threshold value (407).

Via a visualization means, a distance indicator from the current translation along the normal direction of the input face to an original face at the original position is displayed (408). A toggle indication for the distance indicator is obtained (409) based on a toggle signal obtained via a user input device. Via the visualization means, a distance indicator from the current translation along the normal direction of the input face to a snap plane comprising the snap face is displayed (410), instead of the distance indicator from the translation along the normal direction of the input face to the original face at the original position. An overwriting value for the distance indicator is obtained (411), based on an overwriting signal obtained via a user input device. The entity of the CAD model which comprises the input face is adjusted accordingly (412).

Example 5: Perspective Views of an Exemplary Cad Model

FIGS. 5A, 5B, 5C, 5D and 5E show perspective views of an exemplary CAD model as may be displayed to a user via a visualization means. FIGS. 5A to 5E serve to illustrate steps of the first, second, third and/or fourth exemplary embodiment disclosed above.

Figure 5A:
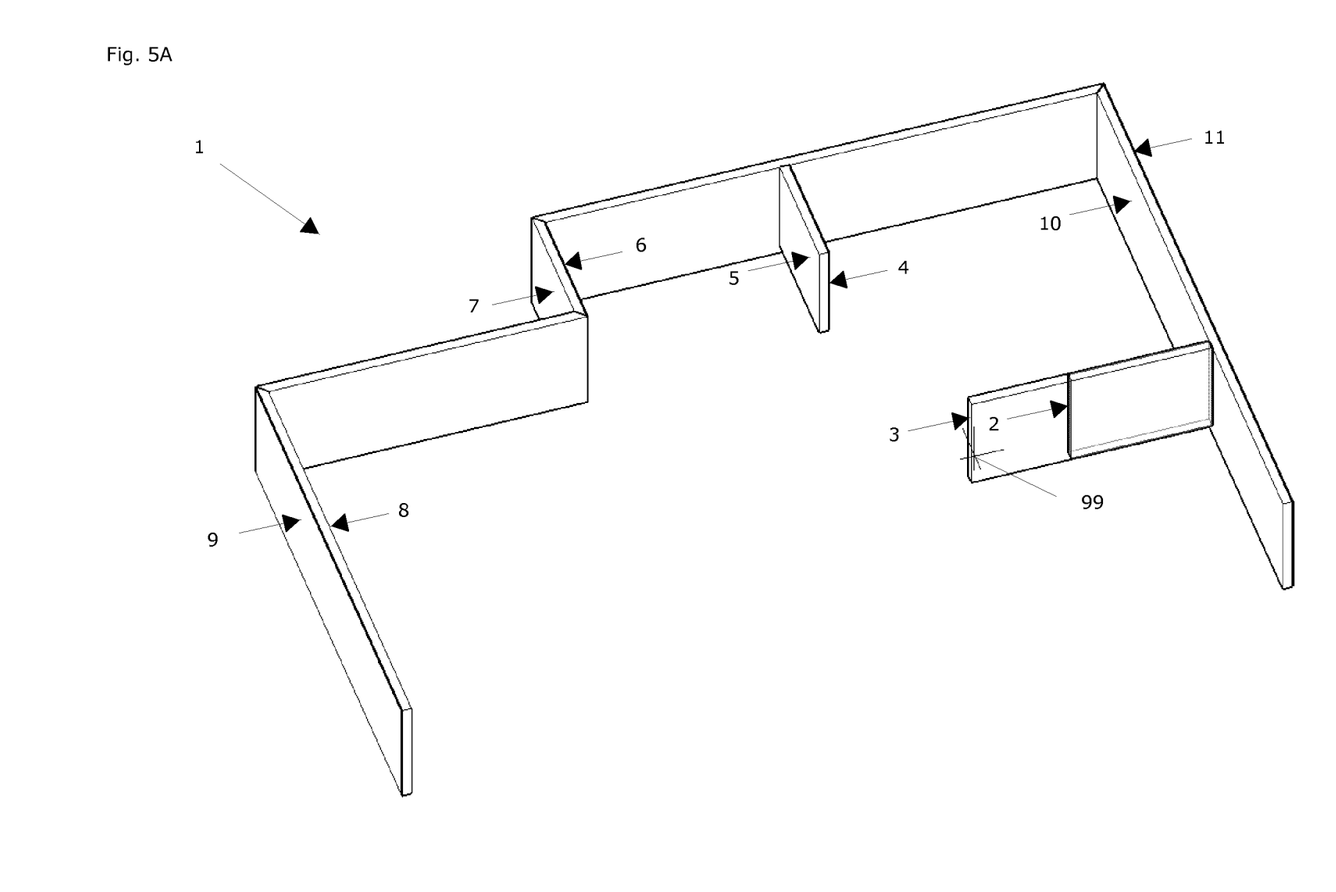
FIGS. 5A, 5B, 5C, 5D and 5E show perspective views of an exemplary CAD model as may be displayed to a user via a visualization means.

In FIG. 5A, a two-dimensional representation comprising a perspective view of a three-dimensional CAD model (1) comprising multiple walls is shown. An input face (2) at an original position may be obtained via user selection with a cursor (99). The CAD model comprises a wall comprising the input face (2). By moving the cursor (99) via, for example, a computer mouse, a current translation (3) for the input face in a normal direction perpendicular to the input face is obtained. The current translation and the original position define a current position. The CAD model comprises a plurality of faces (4, 5, 6, 7, 8, 9, 10, 11) parallel with the input face.

Some faces (4, 5, 6, 7, 8, 9) comprise a positive offset with respect to the original position and some faces (10, 11) comprise a negative offset with respect to the original position. Sorting all other faces (i.e. all faces parallel to the input face other than the input face) of the model based on their offsets, may yield the list of sorted faces: [face (9), face (8), face (7), face (6), face (5), face (4), face (10), face (11)]. Preferably, the list of faces also comprises the offsets.

Figure 5B:
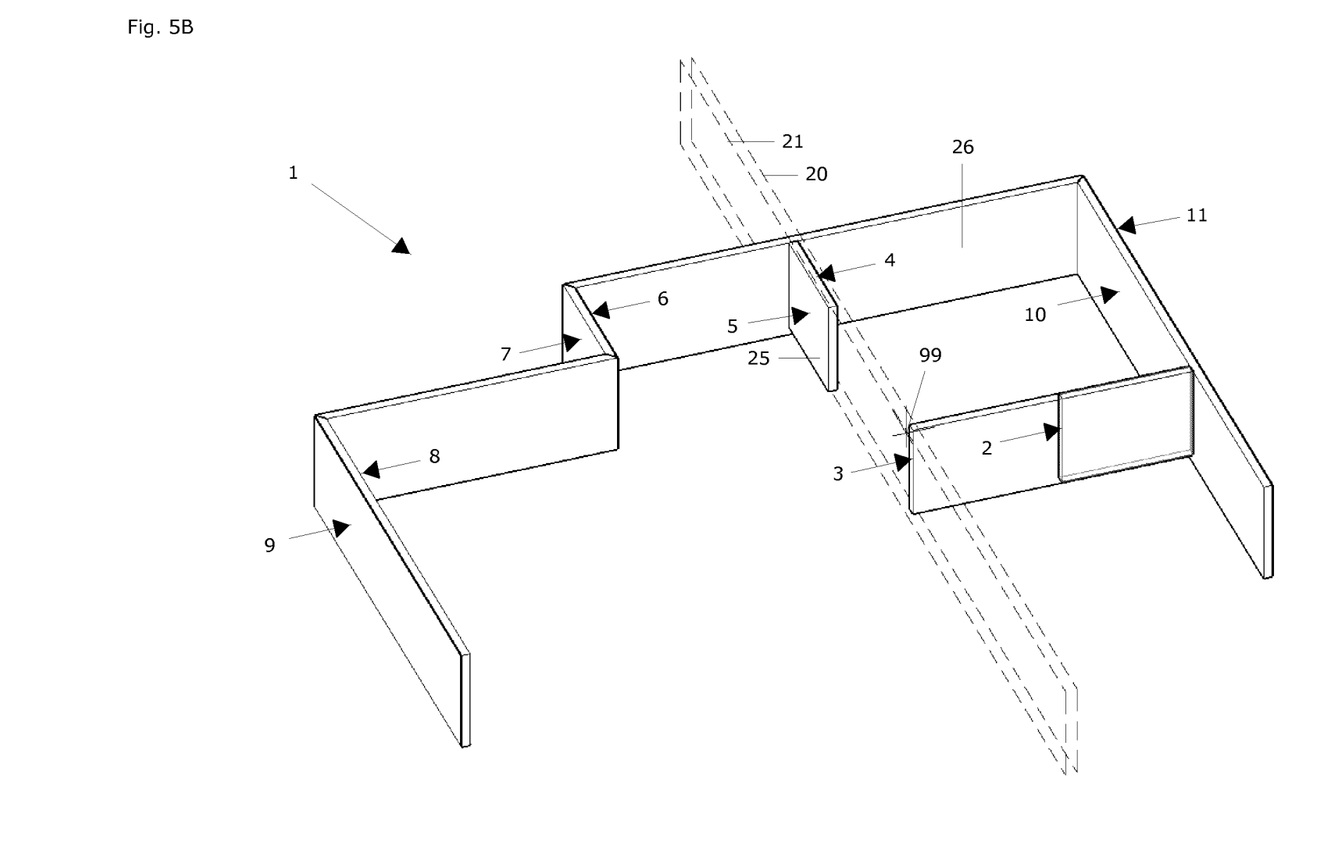

Reference is made to FIG. 5B. In an embodiment according to the present invention, a filter box comprising two filter planes (20, 21) parallel to the input face (2) and encompassing the current position (and hence the cursor (99)) is used to query the spatial tree of the CAD model for solids (25, 26) at least partially within the filter box, thereby obtaining a set of solids. A list of faces (4, 5) is determined based on the set of solids.

Figure 5C:
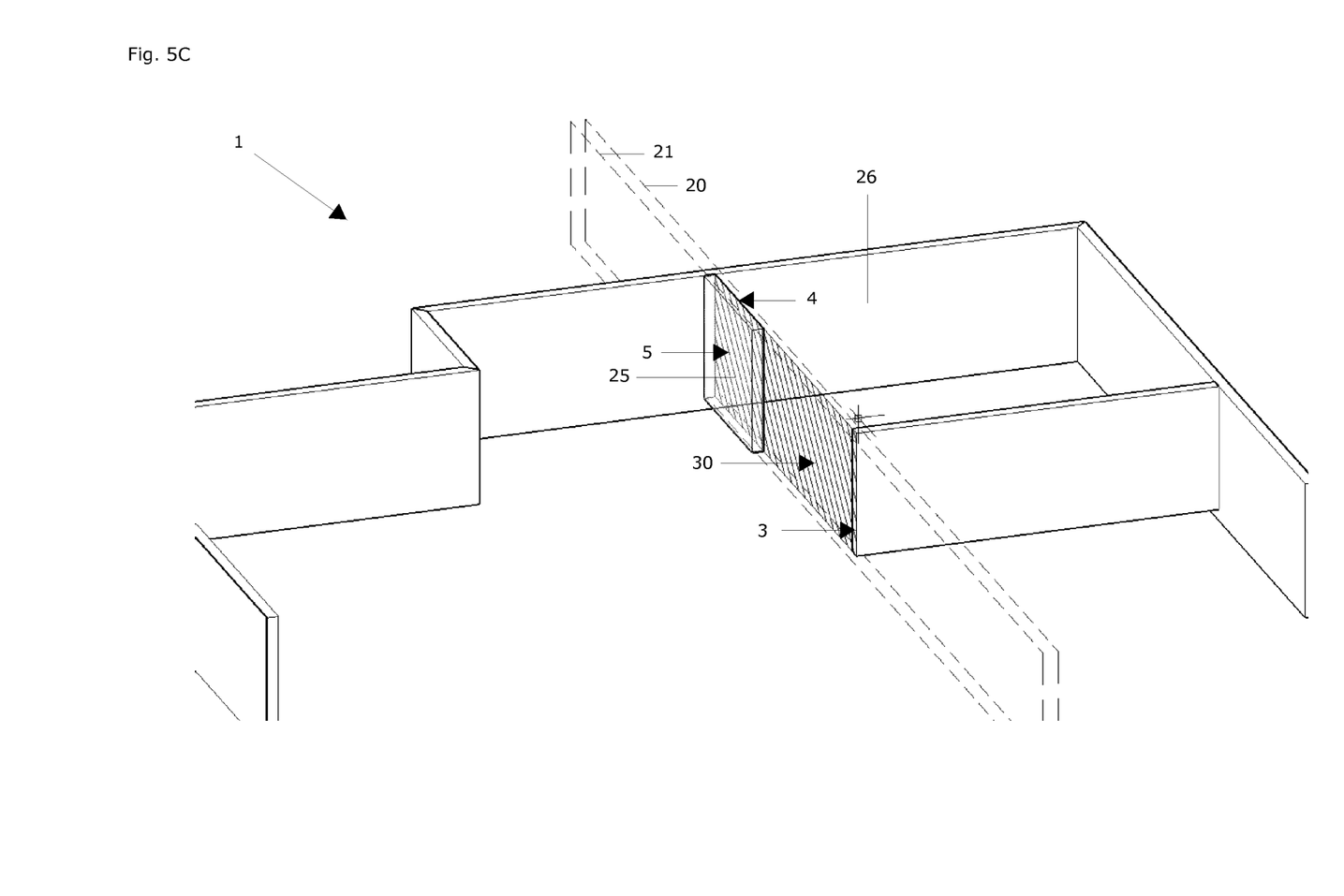

Reference is made to FIG. 5C. The face (4) of the list of faces comprising a smallest distance to the current position is selected as snap face. A snap plane (30) comprising the snap face is displayed via the visualization means. The snap plane comprises a hatched pattern. A translation along the normal direction of the input face coplanar to the snap plane is shown via the visualization means. Note that the cursor (99) does not coincide with the snap plane.

Figure 5D:
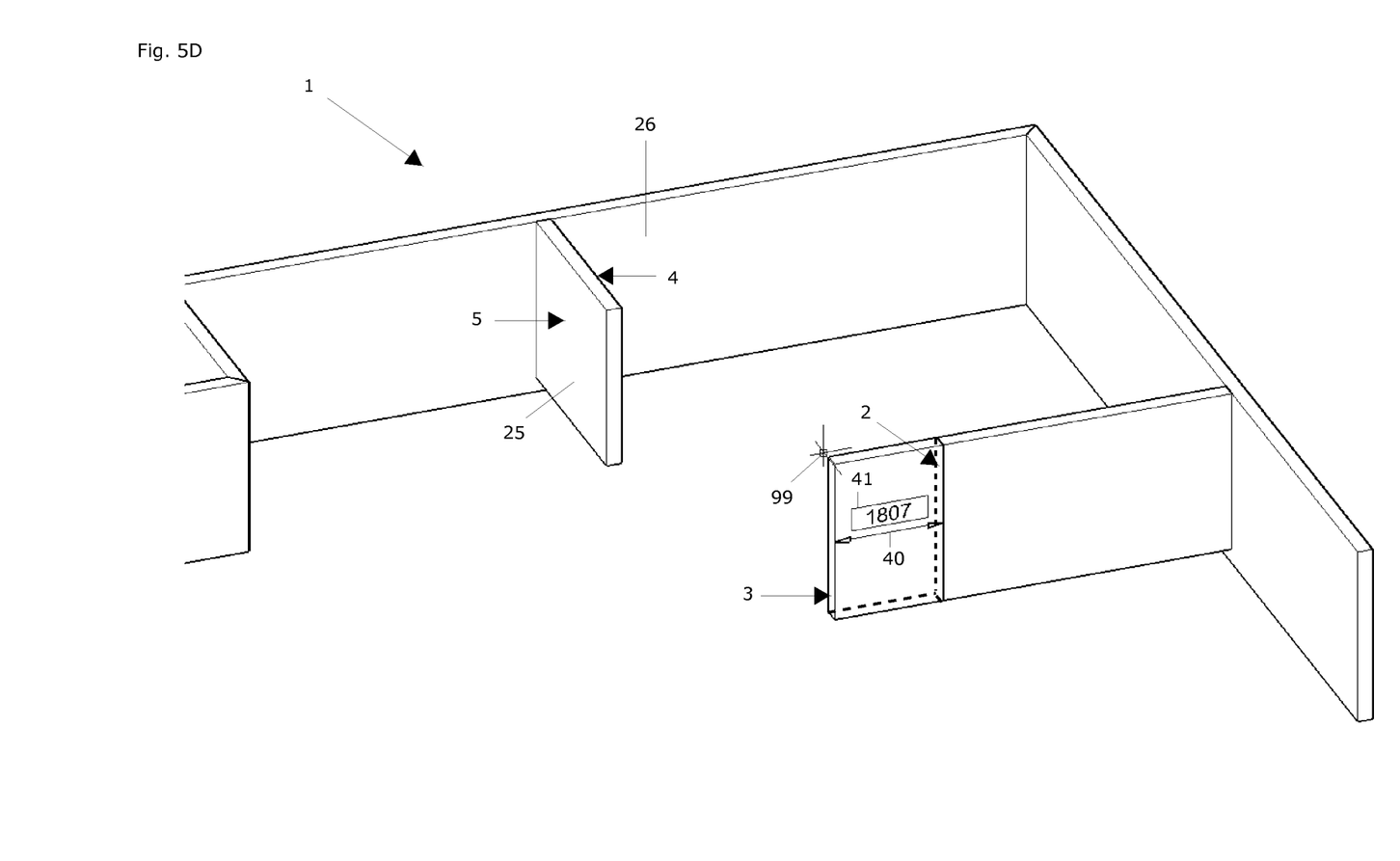

Reference is made to FIG. 5D. In an embodiment, a distance indicator in between the current translation along the normal direction of the input face (3) and an original face at the original position is displayed via a visualization means. The distance indicator comprises an arrow (40) and a textbox (41) comprising a numerical distance value.

Figure 5E:
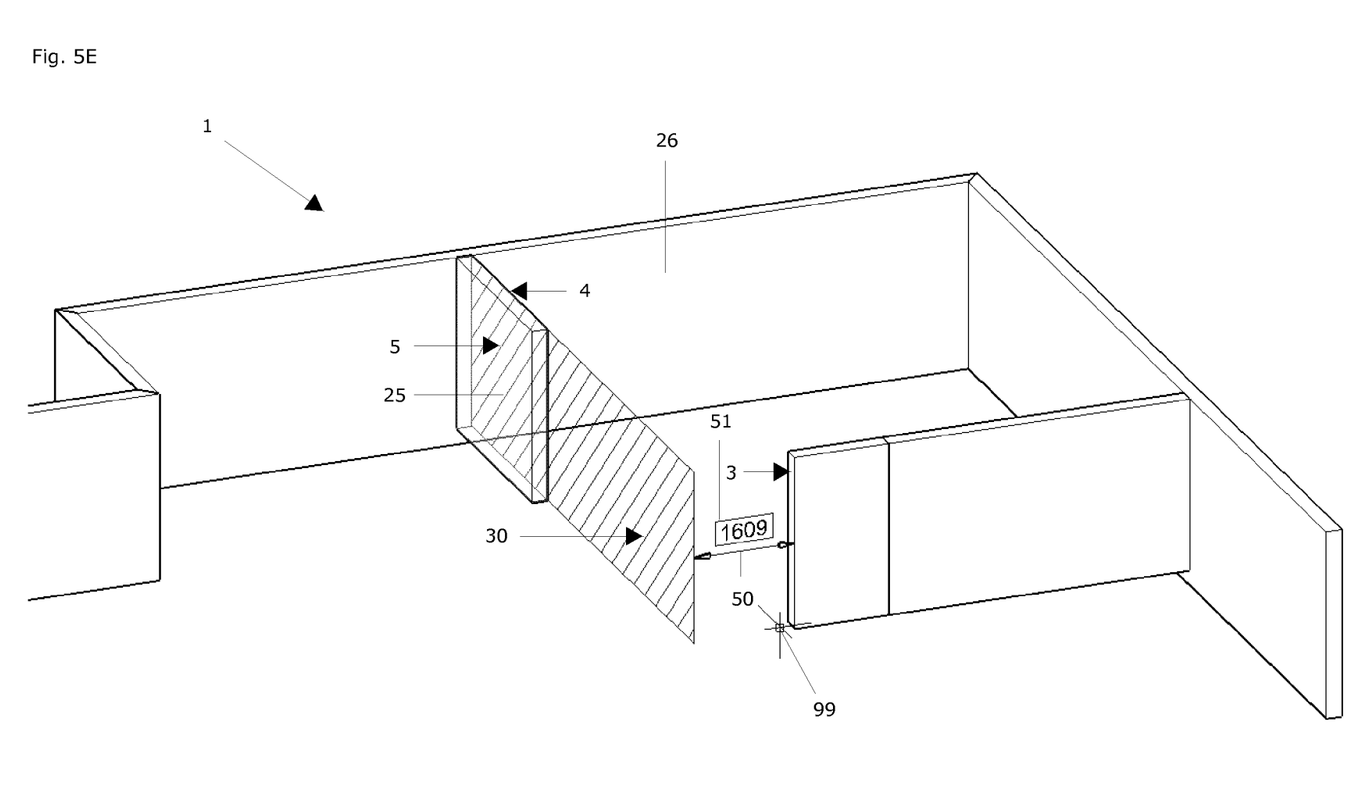

Reference is made to FIG. 5E. Upon pressing TAB on a keyboard, instead of the above distance indicator, a distance indicator in between the current translation along the normal direction of the input face (3) and the snap plane (30) is displayed via the visualization means. The distance indicator comprises an arrow (50) and a textbox (51) comprising a numerical distance value. By overwriting the numerical distance value, via typing a new numerical distance value and pressing ENTER on a keyboard, a new geometry for the wall comprising the input face is obtained.

The invention claimed is:

1. A computer-implemented method for editing a computer-aided design model, comprising:
    obtaining an input face comprising an original position from the computer-aided design model based on a first signal obtained via a user input device, the computer-aided design model including an entity comprising the input face, the input face including a normal direction perpendicular to the input face;
    obtaining a current translation in the normal direction based on a second signal obtained via a user input device, wherein the original position and the current translation define a current position;
    determining from the computer-aided design model a list of faces parallel to the input face;
    selecting from the list of faces a snap face including a distance along the normal direction to the current position which is minimal over the list of faces, without acquiring the snap face via a user input device;
    displaying via a visualization means a snap plane including the snap face and a coplanar alignment of a translation along the normal direction of the input face in the snap plane;
    obtaining an acceptance of the displayed coplanar alignment based on a confirmation signal obtained via a user input device; and
    adjusting the entity of the computer-aided design model including the input face according to the displayed coplanar alignment.

2. The computer-implemented method according to claim 1, further comprising:
    determining from the computer-aided design model a set of entities each at least partially within a filter box including two filter planes parallel to the input face and encompassing the current position; and
    determining from the set of entities the list of faces parallel to the input face.

3. The computer-implemented method according to claim 2, wherein:
    the computer-aided design model includes a spatial tree, and
    the set of entities is determined from the computer-aided design model by querying the spatial tree based on the filter box or the two filter planes.

4. The computer-implemented method according to claim 1, wherein the list of faces includes all other faces of the computer-aided design model which are parallel to the input face or a subset of all other faces of the computer-aided design model which are parallel to the input face.

5. The computer-implemented method according to claim 1, wherein the current translation is obtained after determining the list of faces.

6. The computer-implemented method according to claim 1, further comprising verifying whether the distance along the normal direction of the snap face to the current position is smaller than a threshold value.

7. A computer-implemented method for editing a computer-aided design model, comprising:
    obtaining an input face including an original position from the computer-aided design model based on a first signal obtained via a user input device, the computer-aided design model including an entity that includes the input face, the input face including a normal direction perpendicular to the input face;
    obtaining a current translation in the normal direction based on a second signal obtained via a user input device, wherein the original position and the current translation define a current position;
    determining from the computer-aided design model a list of faces parallel to the input face;
    selecting from the list of faces a snap face including a distance along the normal direction to the current position which is minimal over the list of faces, without acquiring the snap face via a user input device;
    displaying via a visualization means a snap plane including the snap face and a distance indicator from the current position of the input face to the snap plane;
    obtaining an overwriting numerical value for the distance indicator based on an overwriting signal obtained via a user input device; and
    adjusting the entity of the computer-aided design model including the input face according to the overwriting numerical value.

8. The computer-implemented method according to claim 7, further comprising:
    displaying via the visualization means a distance indicator from the current position of the input face to the face at the original position;
    obtaining a toggle indication for the distance indicator based on a toggle signal obtained via a user input device; and
    displaying via the visualization means said distance indicator from the current position of the input face to the snap plane, instead of the distance indicator from the current position of the input face to the face at the original position.

9. The computer-implemented method according to claim 7 wherein:
    each face of the list of faces includes an offset from the original position,
    an offset is a positive, negative or zero numerical value indicating distance along the normal direction to the original position, and
    the method further comprises sorting the faces of the list of faces based on the offsets.

10. The computer-implemented method according to claim 9, wherein the snap face including a closest offset with respect to the current translation is selected from the list of sorted faces.

11. The computer-implemented method according to claim 7, wherein:
    the computer-implemented method is adapted for performing a direct modelling operation on the entity, and
    said adjusting of said entity is the adjusting of the geometry of the entity.

12. The computer-implemented method according to claim 7, wherein:
    the computer-implemented method is adapted for performing a translation of the entity, and
    said adjusting of said entity is the adjusting of the position of the entity.

13. The computer-implemented method according to claim 7, wherein the entity is a wall comprising the input face.

14. A computer system for editing a computer-aided design model, the computer system being configured for performing the computer-implemented method according to claim 1.

15. A computer program product stored on a non-transitory computer readable medium for editing a computer-aided design model, the computer program product comprising instructions which, when the computer program product is executed by a computer, cause the computer to carry out the computer-implemented method according to claim 1.

16. The computer-implemented method according to claim 1, wherein:
    each face of the list of faces includes an offset from the original position,
    an offset is a positive, negative or zero numerical value indicating distance along the normal direction to the original position, and
    the method further comprises sorting the faces of the list of faces based on the offsets.

17. The computer-implemented method according to claim 16, wherein the snap face including a closest offset with respect to the current translation is selected from the list of sorted faces.

18. The computer-implemented method according to claim 1, wherein:
    the computer-implemented method is adapted for performing a direct modelling operation on the entity, and
    said adjusting of said entity is the adjusting of the geometry of the entity.

19. The computer-implemented method according to claim 1, wherein:
    the computer-implemented method is adapted for performing a translation of the entity, and
    said adjusting of said entity is the adjusting of the position of the entity.

20. The computer-implemented method according to claim 1, wherein the entity is a wall comprising the input face.

* * * * *